(12) United States Patent
Stalder et al.

(10) Patent No.: US 11,486,902 B2
(45) Date of Patent: Nov. 1, 2022

(54) IMPEDANCE ASSEMBLY

(71) Applicant: 3M INNOVATIVE PROPERTIES COMPANY, St. Paul, MN (US)

(72) Inventors: Michael H. Stalder, Uedem (DE); Hermanus Franciscus Maria van Meijl, Someren-Eind (NL); Joerg Hahn, Bad Neuenah-Ahrweiler (DE); Lars Schrix, Duisburg (DE)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 17/250,090

(22) PCT Filed: Jun. 6, 2019

(86) PCT No.: PCT/IB2019/054726
§ 371 (c)(1),
(2) Date: Nov. 23, 2020

(87) PCT Pub. No.: WO2019/234682
PCT Pub. Date: Dec. 12, 2019

(65) Prior Publication Data
US 2021/0199697 A1 Jul. 1, 2021

(30) Foreign Application Priority Data

Jun. 8, 2018 (EP) ..................................... 18176682

(51) Int. Cl.
*G01R 15/06* (2006.01)
*G01R 15/16* (2006.01)
*H05K 1/02* (2006.01)

(52) U.S. Cl.
CPC ............. *G01R 15/06* (2013.01); *G01R 15/16* (2013.01); *H05K 1/025* (2013.01); *H05K 2201/10015* (2013.01)

(58) Field of Classification Search
CPC ........ G01R 15/06; G01R 15/16; H05K 1/025; H05K 2201/10015
(Continued)

(56) References Cited

U.S. PATENT DOCUMENTS 7,667,530 B2 2/2010 Chu
9,214,865 B2 12/2015 Levesque
(Continued)

FOREIGN PATENT DOCUMENTS

CA 2859973 6/2013
CN 104037938 9/2014
(Continued)

OTHER PUBLICATIONS

Brunelli, "Non-invasive voltage measurement in a three-phase autonomous meter", Microsyst Technol, 2016, vol. 22, pp. 1915-1926.
(Continued)

*Primary Examiner* — Farhana A Hoque
(74) *Attorney, Agent, or Firm* — Gregg H. Rosenblatt

(57) ABSTRACT

Impedance assembly (120) for use in a voltage divider for sensing an AC elevated voltage of at least 1 kV of a power-carrying conductor (10) distributing electrical energy in a national grid. The impedance assembly comprises a) a PCB (170); b) a high-voltage contact (80) for connection to the power-carrying conductor; c) a first plurality of impedance elements (70) on the PCB, connected to the high-voltage contact and in series with each other such as to be operable in a first voltage divider (20) for sensing the voltage of the power-carrying conductor; and d) a second plurality of impedance elements (71) on the PCB, connected to the high-voltage contact and in series with each other such as to be operable in a second voltage divider (21) for harvesting electrical energy from the power-carrying conductor.

20 Claims, 8 Drawing Sheets

Figure 1:
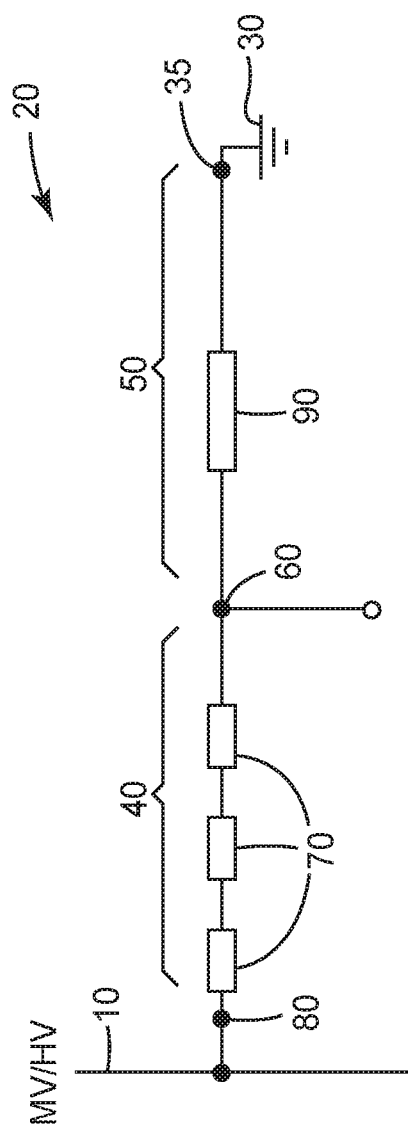

(58) Field of Classification Search
USPC .......................................................... 324/126
See application file for complete search history.

(56) References Cited

U.S. PATENT DOCUMENTS

| | | | |
|---|---|---|---|
| 9,960,342 | B2 | 5/2018 | Miyoshi |
| 2012/0273235 | A1 | 11/2012 | Tosi |
| 2013/0082690 | A1 | 4/2013 | Hakemeyer |
| 2014/0159701 | A1 | 6/2014 | Nabielec |
| 2015/0333725 | A1* | 11/2015 | Sevcik ............... G01R 19/0023 324/157 |
| 2016/0061862 | A1 | 3/2016 | Nulty |
| 2016/0187277 | A1* | 6/2016 | Potyrailo ........... G01N 33/2888 324/633 |
| 2018/0143234 | A1* | 5/2018 | Saxby ................ G01R 15/142 |

FOREIGN PATENT DOCUMENTS

| | | |
|---|---|---|
| CN | 203981760 | 12/2014 |
| CN | 107040144 | 8/2017 |
| DE | 3702735 | 8/1988 |
| EP | 1040322 | 10/2000 |
| EP | 2696206 | 2/2014 |
| EP | 2806277 | 11/2014 |
| EP | 2944967 | 11/2015 |
| EP | 2947466 | 11/2015 |
| EP | 2993480 | 3/2016 |
| EP | 3223024 | 9/2017 |
| GB | 2509965 | 7/2014 |
| JP | 2013-237249 | 11/2013 |
| JP | 2017-209772 | 11/2017 |
| WO | WO 2011-042611 | 4/2011 |
| WO | WO 2015-047939 | 4/2015 |
| WO | WO 2015-179102 | 11/2015 |

OTHER PUBLICATIONS

Cetinkaya, "Electric field energy harvesting in wireless networks", IEEE Wireless Communications, 2017, vol. 24, No. 2, pp. 34-41.
Chang, "Electric field energy harvesting powered wireless sensors for smart grid", Journal of electrical engineering and technology, 2012, vol. 7, No. 1, pp. 75-80.
Dudnikov, "Energy harvesting device for wireless system of monitoring environmental parameters", 2017 IEEE II International Conference on Control in Technical Systems (CTS), 2017.
Guo, "Energy harvesting devices for high voltage transmission line monitoring", Power and Energy Society General Meeting, 2011 IEEE, 8pages.
Moser, "Strong and weak electric field interfering: capacitive icing detection and capacitive energy harvesting on a 220-kv high-voltage overhead powerline", III transactions on industrial electronics, 2011, vol. 58, No. 7, pp. 2597-2604.
Rodriguez, "Energy harvesting from medium voltage electric fields using pulsed flyback conversion", IEEE 8th International Power Electronics and Motion Control Conference, 2016, 8pages.
Zhao, "Energy harvesting for overhead power line monitoring", $9^{th}$ International multi conference on systems, signals and devices, 2012, 5pages.
Zhao, "Power module for a wireless sensor node of a power line monitoring system", 8th International Multi-Conference on Systems, Signals & Devices, 2011, 5pages.
International Search report for PCT International Application No. PCT/IB2019/054726 dated Oct. 11, 2019, 7 pages.
1507 Extended EP Search Report for E18176682.5, PCT/IB2019/054726, dated Dec. 21, 2018, 17 pages.

* cited by examiner

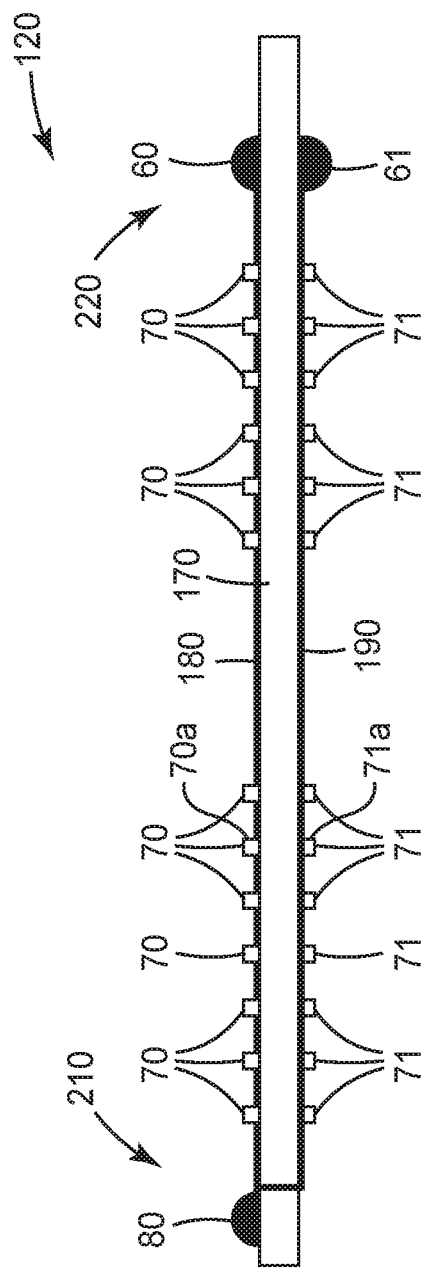
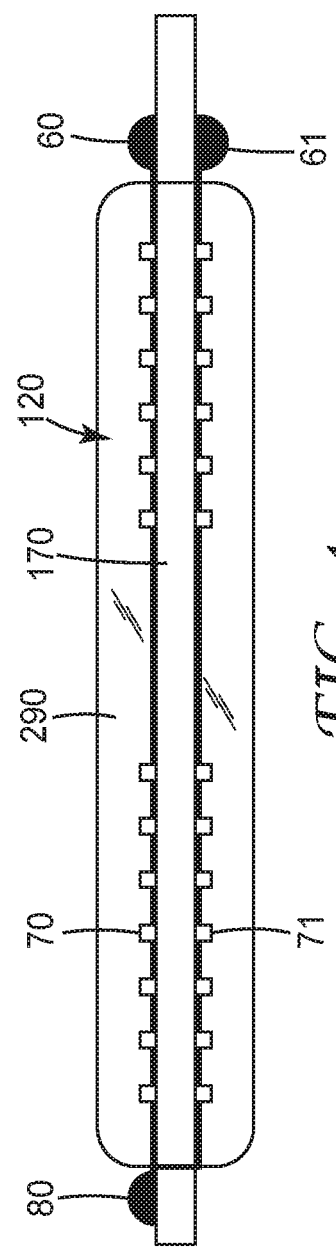

IMPEDANCE ASSEMBLY

The present disclosure relates to voltage dividers that can be used for sensing voltages of inner conductors of medium-voltage (MV) or high-voltage (HV) power cables or of overhead power lines in national grids. It relates in particular to such voltage dividers that can be accommodated in shrinkable or expandable or elastic sleeves for insulating such power cables. It also relates to voltage divider assemblies that allow for harvesting electrical energy.

Distribution of electrical power over large distances, such as in national grids, is typically done using alternating currents ("AC") of tens or hundreds of amps at high voltages of 72 kilovolt ("kV") or more, or at medium voltages of between 1 kV and 72 kV. In order to monitor more closely the state of their power distribution networks, many operators deploy voltage sensors at the ends of power cables, e.g. close to cable terminations, cable splices or pluggable connectors. Some of these voltage sensors use voltage dividers, i.e. chains of serially-connected impedance elements, connected between the elevated voltage (i.e. medium voltage or high voltage) of the power-carrying conductor of the cable and electrical ground, from which a signal voltage can be picked up between two of the impedance elements that is proportional to the elevated voltage. The proportionality factor, i.e. the dividing ratio, of such voltage dividers is often selected such that the signal voltage is in the range of between 1 Volt and 100 Volt, so that common electronic circuitry can process the signal voltage, and derive the elevated voltage from it, and make it available to the network operator.

Voltage dividers for sensing an elevated voltage of an inner conductor of an HV/MV power cable are known, e.g. from the German patent application DE 3702735 A1. Voltage dividers can be formed by a plurality of resistors, capacitors or inductors. Resistors, capacitors and inductors are collectively referred to as impedance elements in this disclosure.

In specific applications, such chains of serially-connected impedance elements have been assembled in impedance assemblies that can be accommodated in insulating material of cable terminations, cable splices or pluggable connectors in a space-saving manner. The European patent application EP 3 223 024 A1 describes an elastic sleeve for insulating a MV/HV power conductor, and a divider assembly arranged in a cavity of the sleeve.

The electronic circuitry for processing the signal voltage requires electrical power at low voltage (typically a few volts) for its own operation. Tapping this operating power from the power cable would require transformation of the elevated voltage down to a few volts, which in turn necessitates an adequately insulated transformer. Supplying the operating power externally requires extra wiring from a power outlet to the circuitry—but only few switching stations are equipped with power outlets. These traditional solutions are thus associated with extra cost, additional equipment, manual labour to install, and are therefore not desirable.

The present disclosure attempts to address these shortcomings. In a first aspect, it provides an impedance assembly for use in a voltage divider for sensing an AC elevated voltage of at least 1 kV versus ground of a power-carrying conductor distributing electrical energy in a national grid, wherein the impedance assembly comprises a) a printed circuit board;
b) an externally accessible high-voltage contact for connection to the power-carrying conductor;
c) a first plurality of impedance elements, arranged on the printed circuit board and electrically connected to the high-voltage contact and in series with each other such as to be operable in a first voltage divider for sensing the elevated voltage of the power-carrying conductor;

characterized in that the impedance assembly further comprises d) a second plurality of impedance elements, arranged on the printed circuit board and electrically connected to the high-voltage contact and in series with each other such as to be operable in a second voltage divider for harvesting electrical energy from the power-carrying conductor.

The impedance assembly according to the present disclosure provides a second plurality of impedance elements which allows harvesting energy from the power-carrying conductor. This harvested power can be supplied to electronic circuitry, e.g. circuitry for processing the signal voltage picked up from the first voltage divider. This makes the provision of a separate power supply for the circuitry obsolete and allows deployment of a voltage sensor in places where no external power is available.

Also, the second plurality of impedance elements is arranged on the same printed circuit board ("PCB") as the first plurality of impedance elements. This arrangement may make the provision of a dedicated support for the second plurality of impedance elements obsolete, along with the need to separately insulate the dedicated support and the second plurality of impedance elements. The impedance assembly according to the present disclosure therefore saves cost and space.

The impedance assembly of the present disclosure is for electrical connection to the power-carrying conductor, between the elevated voltage of the power-carrying conductor and electrical ground. For connection to the power-carrying conductor, the impedance assembly comprises a high-voltage contact. This contact is externally accessible, so that, for example, a wire or another conductive element can be mechanically and electrically connected to it, e.g. by soldering. In this example, one end of the wire may be connected to the high-voltage contact, and the opposite end of the wire may be connected to the power-carrying conductor. "Externally accessible" refers to the contact being accessible from outside the impedance assembly.

Both the first and the second plurality of impedance elements are electrically connected to high-voltage contact, so that they are connected to the power-carrying conductor once the high-voltage contact is connected to the power-carrying conductor.

The high-voltage contact may be, for example, a soldering contact on the PCB, or a contact of a plug, of a socket or of a connector comprised in the impedance assembly, so that an electrical connection with the power-carrying conductor can be established via a matching socket, plug or connector at an end of a wire, the opposite end of which can be connected to the power-carrying conductor.

Generally, the power-carrying conductor is a conductor that is suitable for distributing electrical energy in a national grid, i.e. at currents of tens or hundreds of amps and at voltages of at least 1 kV. The power-carrying conductor may be, or may comprise, for example an inner conductor of a MV or HV power cable. Alternatively the power-carrying conductor may be, or comprise, for example a bus bar.

An impedance element may be, for example, a resistor, a capacitor or an inductor. A plurality of impedance elements may comprise one resistor and one or more capacitors. A plurality of impedance elements may comprise one resistor and one or more inductors. A plurality of impedance elements may comprise one inductor and one or more capacitors. Generally, the plurality of impedance elements may comprise one or more resistors, and/or one or more capacitors and/or one or more inductors. Resistors, capacitors and inductors are particularly suitable elements to form a voltage divider, because they are readily available at moderate cost. Also, their electrical properties are generally precisely specified.

Nominal impedance of an impedance element is measured in Ohm, where the impedance element is a resistor, in Farad, where the impedance element is a capacitor, and in Henry, where the impedance element is an inductor.

In the present disclosure, the expression "printed circuit board" or synonymously "PCB" is meant to include all types of PCBs, in particular rigid PCBs and flexible PCBs, single-layer PCBs and multi-layer PCBs, polymeric PCBs and ceramic PCBs, rectangular and non-rectangular PCBs.

Voltage dividers can be used for sensing an elevated voltage of a power-carrying conductor ("sensing voltage dividers") or for harvesting electrical energy from an elevated voltage of a power-carrying conductor ("harvesting voltage dividers"). Both types of voltage dividers are formed by a plurality of resistors, capacitors or inductors, electrically connected in series with each other such as to form an electrical chain. Resistors, capacitors and inductors are collectively referred to as impedance elements in this disclosure. Generally, one end of a voltage divider is electrically connected to the elevated voltage to be measured or to be harvested, while the opposed end is connected to lower voltage or on electrical ground. Voltage dividers formed by a greater number of impedance elements connected in series may be advantageous because the voltage drop across each of the impedance elements is smaller than with only a few, e.g. two, impedance elements, thus reducing electrical stress and the risk of failure.

Generally, a voltage divider comprises one or more impedance elements forming a high-potential portion of the voltage divider, and one more impedance elements forming a low-potential portion of the voltage divider. A pickup contact is normally provided between the high-potential portion and the low-potential portion. The pickup contact can serve different purposes, such as picking up a signal from a voltage divider (in which case it may be referred to as a "signal contact") or harvesting energy from a voltage divider (in which case it may be referred to as a "harvesting contact"). Hence, a signal contact may be connected to the first plurality of impedance elements between two impedance elements of the first plurality. A harvesting contact may be connected to the second plurality of impedance elements between two impedance elements of the second plurality.

In an impedance assembly according to the present disclosure, the first voltage divider is a sensing voltage divider. In a sensing voltage divider, a divided voltage or "signal voltage" can be picked up from the signal contact which varies proportionally with the AC elevated voltage of the power-carrying conductor.

The proportionality factor of a sensing voltage divider, i.e. the dividing ratio of a sensing voltage divider, is generally the ratio of the total impedance of the high-potential portion and the total impedance of the low-potential portion. The impedance elements arranged electrically between the signal contact and the high-voltage contact form the high-potential portion, and the impedance elements arranged electrically between the signal contact and the lower voltage or electrical ground form the low-potential portion of the voltage divider.

Therefore, in certain embodiments, an impedance assembly according to the present disclosure further comprises a signal contact, connected to the first plurality of impedance elements such as to provide a signal voltage that varies proportionally with the elevated voltage of the power-carrying conductor.

The second voltage divider is a harvesting voltage divider. In a harvesting voltage divider, current can be harvested through a harvesting contact, which is electrically connected like the signal contact in the sensing voltage divider. A harvesting contact may be connected to the second plurality of impedance elements between two impedance elements of the second plurality. In certain embodiments, the impedance assembly thus further comprises a harvesting contact, connected to the second plurality of impedance elements such as to allow harvesting electrical energy from the power-carrying conductor.

In impedance assemblies according to the present disclosure, the first plurality of impedance elements may form the high-potential portion of the first voltage divider. Other impedance element(s) forming the low-potential portion of the first voltage divider may or may not be comprised in the impedance assembly. They may, for example, be arranged outside the impedance assembly, such as in a separate electronics container. In any case, the signal contact may be arranged in or on the impedance assembly, or it may be arranged outside of the impedance assembly, e.g. in or on the electronics container.

Alternatively, in other impedance assemblies according to the present disclosure, the first plurality of impedance elements may form both the high-potential portion and the low-potential portion of the first voltage divider. In other words: certain impedance elements of the first plurality of impedance elements may form the high-potential portion, while other impedance elements of the first plurality of impedance elements may form the low-potential portion of the first voltage divider. In this case, the signal contact is preferably arranged in or on the impedance assembly.

The first voltage divider is suitable for sensing the elevated voltage of the power-carrying conductor. For this sensing it is advantageous for the chain of impedance elements between the high-voltage contact and electrical ground or low voltage to provide a higher total impedance, so that only small currents flow through the first voltage divider and electrical losses are smaller. For energy harvesting, however, it is generally advantageous for the chain of impedance elements between the high-voltage contact and electrical ground or low voltage to provide a lower total impedance, so that greater currents can flow and more energy can be harvested.

Where it is desired to sense the elevated voltage of the power-carrying at a high precision, the proportionality factor between elevated voltage and signal voltage must be known to a finer degree. This requires the dividing ratio of a sensing voltage divider to be precisely determined, i.e. the ratio of total impedances of the high-potential portion and of the low-potential portion. Impedance elements of the first plurality of impedance elements used in sensing voltage dividers are therefore generally selected for greater precision (e.g. less than 5% deviation from their nominal impedance value in Ohm, Farad, or Henry) of their actual impedance values. For the dividing ratio to vary little with varying temperature, impedance elements of the first plurality of impedance elements used in sensing voltage dividers are generally also selected for particularly small variations of their actual impedance values with temperature.

Precision is generally not so much of a concern in the second (harvesting) voltage divider, because electronic circuitry can be operated with supply voltages varying within a wide range around their nominal values. Hence impedance elements of the second plurality of impedance elements used in the second voltage divider are generally not selected for greater precision of their actual impedance values or for variation with temperature.

In impedance assemblies according to the present disclosure, the second plurality of impedance elements may form the high-potential portion of the second voltage divider. Other impedance element(s) forming the low-potential portion of the second voltage divider may or may not be comprised in the impedance assembly. They may, for example, be arranged outside the impedance assembly, such as in a separate electronics container. In this scenario, the signal contact may be arranged in or on the impedance assembly.

Alternatively, in other impedance assemblies according to the present disclosure, the second plurality of impedance elements may form both the high-potential portion and the low-potential portion of the second voltage divider. In other words: certain impedance elements of the second plurality of impedance elements may form the high-potential portion, while other impedance elements of the second plurality of impedance elements may form the low-potential portion of the second voltage divider. In this case, the signal contact is preferably arranged in or on the impedance assembly.

The electrical energy which the second plurality of impedance elements can harvest may be used to power electrical or electronic devices of any kind. In particular, it may be used to power a processing unit which processes the signal voltage provided by the first plurality of impedance elements, and which thereby senses the elevated voltage of the power-carrying conductor. To that end, the processing unit may comprise electric or electronic circuitry which processes the signal voltage. Depending on the circumstances, such circuitry requires at least 10 mW, at least 20 mW, at least 50 mW, or at least 100 mW to operate. Mostly, 50 mW are sufficient to operate such a processing unit.

Hence, in certain embodiments, the respective impedances of the second plurality of impedance elements are chosen such that the second voltage divider can harvest electrical energy of at least 50 milliwatt (mW) from the power-carrying conductor.

In certain embodiments, the second plurality of impedance elements is comprised in an inductor-less step-down converter to convert the elevated voltage of the power-carrying conductor to a voltage of 400 Volt or less. This will allow to harvest more electrical energy and to supply more power to the electronic circuitry mentioned above.

In certain of these embodiments, the inductor-less step-down converter converts the positive and the negative half-wave of the elevated AC voltage of the power-carrying conductor to a voltage of 400 Volt or less. This can help avoid a DC load on certain capacitors within the second plurality of impedance elements, i.e. of the harvesting voltage divider, thereby increase the reliability and/or accuracy of the harvesting voltage divider.

In certain embodiments, in which the impedance assembly comprises a signal contact as described above, a wire is secured, e.g. soldered, to the signal contact. The wire leads the signal voltage to a processing unit outside the impedance assembly, in which electric or electronic circuitry processes the signal voltage in order to determine the actual voltage of the power-carrying conductor. A hard-wired connection between the impedance assembly and the processing unit is reliable, but makes it difficult to separate the impedance assembly from the processing unit in case one of these two components fails and needs to be replaced.

A separable and re-connectable connection may thus be desirable. For that purpose, a separable and re-connectable interface connector, comprised in the impedance assembly, may be provided, in which one connector contact is connected to the signal contact. The interface connector facilitates mating with a corresponding plug on the end of a wire or cable which may lead the signal voltage on to the processing unit.

Hence, in certain embodiments, an impedance assembly as described herein comprising a signal contact further comprises an interface connector for mechanical and electrical mating with a corresponding plug, wherein the interface connector comprises a plurality of connector contacts for transmitting electrical signals into the plug, and wherein one of the connector contacts is electrically connected to the signal contact.

According to the present disclosure, the first plurality of impedance elements and the second plurality of impedance elements are arranged on the PCB. The PCB may thus support the first plurality of impedance elements and/or the second plurality of impedance elements. The PCB may comprise conductive traces for electrically connecting impedance elements with each other. Such conductive traces may be arranged on an outer surface of the PCB or may be arranged within the PCB, e.g. on an internal layer of a multilayer PCB. Such conductive traces on or in the PCB may connect certain or all impedance elements of the first plurality of impedance elements with one or more respective adjacent impedance elements of the first plurality. Similarly, such conductive traces on or in the PCB may connect certain or all impedance elements of the second plurality of impedance elements with one or more respective adjacent impedance elements of the second plurality.

Alternatively, however, impedance elements may be arranged on the PCB while the electrical connections between them may be formed by elements which are not comprised in the PCB, e.g. by external wires or external connectors or a further PCB.

The impedance elements of the first plurality (and also those of the second plurality) of impedance elements are electrically connected in series with each other. Except for the impedance elements at the ends of this "chain", impedance elements therefore are electrically connected between one electrically-adjacent impedance element and another electrically-adjacent impedance element.

The last impedance element at the high-voltage end of the chain of impedance elements is connected to the high-voltage contact. It thereby connects the high-potential portion of first or second voltage divider to the high-voltage contact and—in use—to the elevated voltage of the power-carrying conductor. The last impedance element at the opposite, low-voltage end of the chain of impedance elements may—in use—be electrically connected to electrical ground or to an element on low voltage, whereby the low-potential portion of the first or second voltage divider is connected to ground or to a low voltage.

Where the low-potential portion of the (first or second) voltage divider is not comprised in the impedance assembly, the last impedance element at the opposite, low-voltage end of the chain of impedance elements may—in use—be electrically connected to the low-potential portion of the respective (first or second) voltage divider, which in turn is connected to ground or to a low voltage.

Generally, the arrangement of the impedance elements of the first plurality or of the second plurality of impedance elements on the PCB is not particularly limited. In certain embodiments of the impedance assembly according to the present disclosure, the PCB has a first major outer surface and an opposed second major outer surface, such as an opposed second major surface parallel to the first major surface. In some of these embodiments, the first plurality of impedance elements is arranged on the first major outer surface, and the second plurality of impedance elements is arranged on the second major outer surface.

In certain other of these embodiments, the first plurality of impedance elements is arranged on the first major outer surface, and the second plurality of impedance elements is also arranged on the first major outer surface.

In certain embodiments, certain impedance elements of the first plurality of impedance elements are arranged on the first major outer surface, and certain other impedance elements of the first plurality of impedance elements are arranged on the second major outer surface of the PCB.

In certain embodiments of an impedance assembly according to the present disclosure, each impedance element of the second plurality of impedance elements is arranged directly opposite, i.e. only separated by the thickness of the PCB, of a corresponding impedance element of the first plurality of impedance elements. The effect of this arrangement is that the electrical field gradient which a "sensing" impedance element (i.e. an impedance element of the first plurality) "sees" in the direction of the opposed "harvesting" impedance element (i.e. an impedance element of the second plurality) may be reduced. The impedance elements of the second plurality thus provide a form of electrical shielding to the impedance elements of the first plurality, arranged opposite to them. This reduced electrical field gradient may reduce parasitic currents from the first plurality of impedance elements through the PCB. This may eventually result in a higher measurement accuracy of the first ("sensing") voltage divider and a more precise sensing of the voltage of the power-carrying conductor.

Hence, in certain embodiments, in which the first plurality of impedance elements is arranged on the first major outer surface, and the second plurality of impedance elements is arranged on the second major outer surface, a first impedance element of the first plurality of impedance elements is arranged at a first position on the first major outer surface, and a first impedance element of the second plurality of impedance elements is arranged at the same first position on the second major outer surface.

For even better shielding, it may be desirable to place a second impedance element of the second plurality opposite to a corresponding second impedance element of the first plurality. Hence, in certain of the embodiments described above, a second impedance element of the first plurality of impedance elements is arranged at a second position on the first major outer surface, and a second impedance element of the second plurality of impedance elements is arranged at the same second position on the second major outer surface.

In the present disclosure, an impedance element is understood to be arranged directly opposite to another impedance element on a flat PCB having a first and a parallel second outer surface, if the first impedance element is arranged in a specific two-dimensional position on the first major surface of the PCB, and the second impedance element is arranged in the same two-dimensional position on the second major surface of the PCB such, that the impedance elements are separated from each other only in the thickness direction of the PCB, but not in the in-plane direction of the PCB.

Impedance elements arranged on one major surface of the PCB can be arranged geometrically in different patterns. The impedance assembly extends physically between an element on elevated voltage and an element on low voltage or electrical ground. This voltage drop needs to be accommodated by the chain of serially-connected impedance elements, e.g. by those impedance elements of the first plurality and by those of the second plurality. A linear arrangement of a chain of impedance elements, i.e. an arrangement in which the impedance elements are arranged to form a straight row, is advantageous, because it reduces the risk of electrical breakdown between impedance elements, in particular between impedance elements of the same chain, i.e. within the same plurality of impedance elements. In such linear arrangements, the voltage drop is somehow evenly distributed along the chain of impedance elements.

An electrically slightly less preferred arrangement is an arrangement in two rows of impedance elements. In such arrangements, a first row may be formed by the first, the third, the fifth, the seventh etc. impedance element of the first chain (or the second chain), and a second row may be formed by the second, fourth, sixth, eighth, etc. impedance element of the first chain (or the second chain). The chain may thus not be arranged straight, so that its impedance elements form a single row, but instead the chain may be arranged in a Z-shape, so that its impedance elements form two parallel straight rows.

Hence in certain embodiments, the first plurality of impedance elements is arranged to form a straight row of impedance elements or two straight rows of impedance elements. Independent of the arrangement of the impedance elements of the first plurality, the second plurality of impedance elements may be arranged to form a straight row of impedance elements or two straight rows of impedance elements.

A risk of electrical breakdown between elements of the impedance assembly is lower, if the voltage drop from the high-voltage end of the impedance assembly to the low-voltage end is particularly smooth or even along the length direction of the chain of serially-connected impedance elements. To this end, in certain embodiments, all impedance elements of the first plurality have the same nominal impedance. In certain of these embodiments, also all impedance elements of the second plurality have the same nominal impedance, which may be different from the nominal impedance of the impedance elements of the first plurality.

Hence in certain embodiments, each impedance element of the first plurality of impedance elements has a same first nominal impedance, and/or each impedance element of the second plurality of impedance elements has a same second nominal impedance.

Such a design is particularly advantageous where the first plurality of impedance elements is arranged on the first major outer surface of the PCB in a first straight row, and the second plurality of impedance elements is arranged on the second major outer surface of the PCB in a second straight row. The second straight row may be parallel to the first straight row.

Generally, in the context of the present disclosure, the term "impedance element" refers to a capacitor, a resistor, or an inductor. An impedance element, i.e. a capacitor, a resistor, or an inductor may be a discrete impedance element, i.e. a discrete capacitor, a discrete resistor, or a discrete inductor. As used herein, a discrete impedance element is an individual electrical element that exists independently from other electrical elements, from the PCB or from conductive traces on the PCB. In particular, a discrete impedance element is not formed by conductive traces on an outer surface of a PCB, or in a PCB.

A discrete impedance element may be, in particular, a surface mount discrete impedance element, i.e. one that can be mounted on an outer surface of a PCB.

In certain embodiments, each impedance element of the first plurality of impedance elements is a discrete, surface-mount capacitor, and/or each impedance element of the second plurality of impedance elements is a discrete, surface-mount capacitor.

Discrete surface-mount capacitors of suitable capacitances in the nanofarad and picofarad range are commercially available at high nominal precision ratings and are therefore useful in impedance assemblies according to the present disclosure. Also, discrete surface-mount capacitors can be replaced more easily as long as the major outer surfaces of the PCB are accessible.

The voltage drop across each impedance element in a chain of impedance elements (i.e. in the first plurality or in the second plurality of impedance elements) is smaller, if the elevated voltage is divided down by a larger number of impedance elements, as opposed to by fewer impedance elements. The requirements for the voltage withstand of the individual impedance elements of the respective chain can thus be lower.

Hence, in certain embodiments of the present disclosure, the first plurality of impedance elements comprises more than twenty impedance elements, and/or the second plurality of impedance elements comprises more than twenty impedance elements.

In order to better protect an impedance assembly according to the present disclosure against electrical breakdown and/or arcs forming between individual impedance elements, the impedance assembly may be embedded, or encapsulated, partially or fully, in an electrically insulating encapsulation body. The encapsulation body may provide additional electrical insulation to the elements which it encapsulates. It may also provide additional protection against mechanical impacts, chemical impacts or environmental impacts.

A portion of the printed circuit board of the impedance assembly, or the entire printed circuit board, may be encapsulated in the encapsulation body. Independent from encapsulation of other elements, some or all impedance elements of the first plurality of impedance elements may be encapsulated in the encapsulation body. Independent from encapsulation of other elements, some or all impedance elements of the second plurality of impedance elements may be encapsulated in the encapsulation body.

The encapsulation body may be in direct surface contact with an outer surface of the elements which it encapsulates, such as with an outer surface of impedance elements or with an outer surface of the printed circuit board.

The encapsulation body may be deformable, e.g. elastic, or it may be rigid. A deformable encapsulation body may facilitate insertion of the impedance assembly into a cavity of a sleeve, particularly if the sleeve has a low elasticity. A rigid encapsulation body, however, may provide for a higher stiffness of the impedance assembly and facilitate insertion of the impedance assembly into a cavity of an elastic sleeve, e.g. a sleeve of a cable termination, a cable splice, or a cable connector.

Hence in certain embodiments, at least a portion of the impedance assembly is encapsulated in a rigid, electrically insulating encapsulation body.

The encapsulation body may form a smooth outer surface. Such a smooth outer surface may reduce the number and size of voids between the impedance assembly and the inner wall of the cavity, when the impedance assembly is arranged in the cavity.

The encapsulation body may consist of a resin. The resin may be a hardened resin. The hardened resin may be hardened from a curable liquid resin. The PCB with the impedance elements may be submerged in the curable liquid resin while the resin is liquid. The resin may then be cured and allowed to solidify and harden, so that it forms the solid encapsulation body.

The encapsulation body may be transparent. This may facilitate visual inspection of the impedance assembly, of the impedance elements and of the printed circuit board.

The present disclosure also provides a sensing assembly comprising an impedance assembly as described herein and a processing unit, electrically connected to the first plurality of impedance elements. The processing unit may be suitable for processing the signal voltage and sensing the AC elevated voltage versus ground of the power-carrying conductor. The processing unit may be, for example, a PCB with electronic circuitry for processing the signal voltage and generate an electrical signal indicative of the AC elevated voltage of the power-carrying conductor sensed by the sensing voltage divider.

Where the impedance assembly comprises a signal contact providing a signal voltage that varies proportionally with the elevated voltage of the power-carrying conductor, the processing unit is preferably electrically connected to the signal contact.

In some embodiments, the processing unit is provided with electrical power by an external power supply. In other, preferred embodiments, however, the processing unit is powered by electrical energy harvested by the second voltage divider. Powering the processing unit by energy harvested from the second plurality of impedance elements allows for more independent placement of a voltage sensor on a power-carrying conductor, because neither an external power supply nor any cable leading to this external power supply is required.

Hence generally the present disclosure also provides a sensing assembly comprising
a) an impedance assembly comprising a signal contact connected to the first plurality of impedance elements such as to provide a signal voltage that varies proportionally with the elevated voltage of the power-carrying conductor, and
b) a processing unit, electrically connected to the signal contact and powered by electrical energy harvested by the second voltage divider, for processing the signal voltage and sensing the AC elevated voltage versus ground of the power-carrying conductor.

In such a sensing assembly the processing unit may comprise an antenna for wirelessly transmitting a signal indicative of the AC elevated voltage versus ground of the power-carrying conductor. Wireless transmission makes a wired connection obsolete. Where the processing unit is powered by energy harvested from the second plurality of impedance elements, wireless transmission allows for completely independent placement of a voltage sensor on a power-carrying conductor, since neither power supply nor data transmission requires a wired connection. The processing unit may wirelessly transmit the signal to a so-called RTU to make the value of the sensed voltage available to a network operator.

In certain embodiments, the processing unit comprises a Bluetooth interface for wirelessly transmitting the signal according to a protocol described in part 5 of standard 60870 of the International Electrotechnical Commission IEC, as in force on 26 Apr. 2019, e.g. according to a protocol IEC 60870-5-103 as in force on 26 Apr. 2019.

Generally, an impedance assembly according to the present disclosure can be placed independently from a cable termination, cable splice or pluggable cable connector, provided it is suitably insulated. Its placement in a cavity of an insulating sleeve of a cable termination, of a cable splice or of a pluggable connector makes use of the existing insulation of these accessories for insulation of the impedance assembly.

Where the cavity of the sleeve does not provide sufficient space for accommodating a processing unit as described above, it may be necessary to provide a separate housing, such as an RTU box, to accommodate the processing unit.

In certain sensing assemblies, however, the processing unit may not only be connected to an impedance assembly for sensing the voltage of the power-carrying conductor, but also to a current sensor for sensing a current through the power-carrying conductor. In these sensing assemblies, the processing unit may be accommodated in a housing of the current sensor.

Therefore, a sensing assembly as described above may further comprise a current sensor, connected to the processing unit, for sensing a current through the power-carrying conductor, and a housing containing a component of the current sensor, wherein the processing unit is arranged in the housing.

The present disclosure also provides a power network for distributing electrical energy in a national grid, comprising an impedance assembly as described herein, or comprising a sensing assembly as described above.

The invention will now be described in more detail with reference to the following Figures exemplifying particular embodiments of the invention, where like elements are indicated by like reference numbers.

Figure 2:
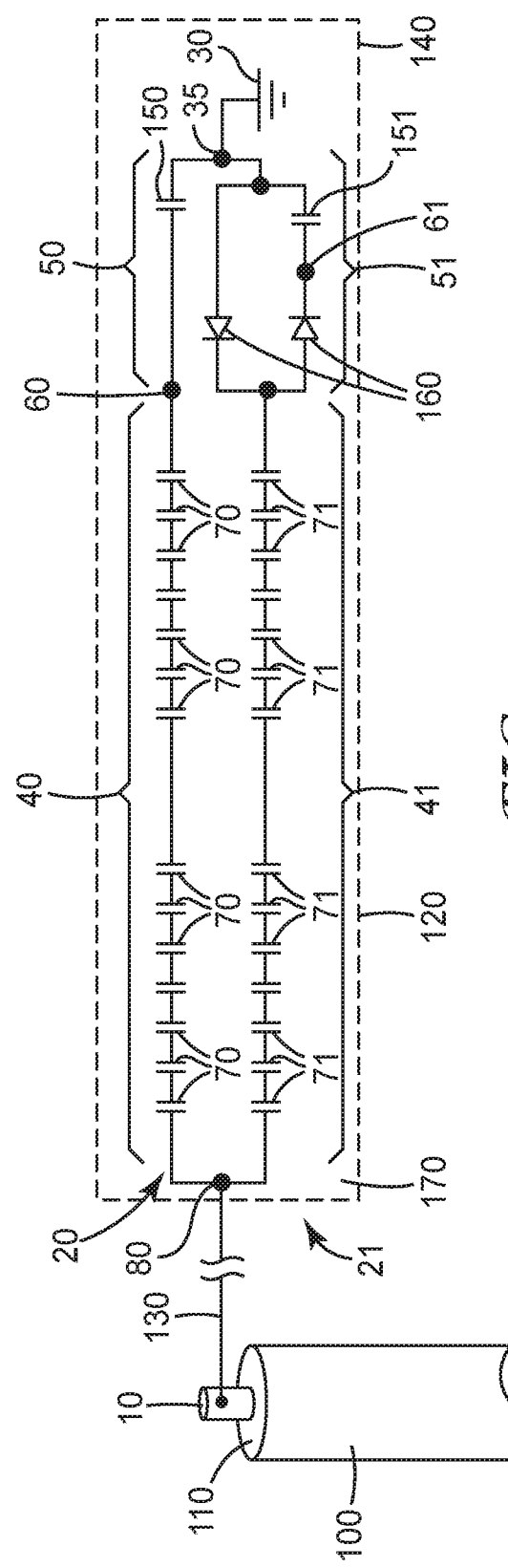
Figure 5:
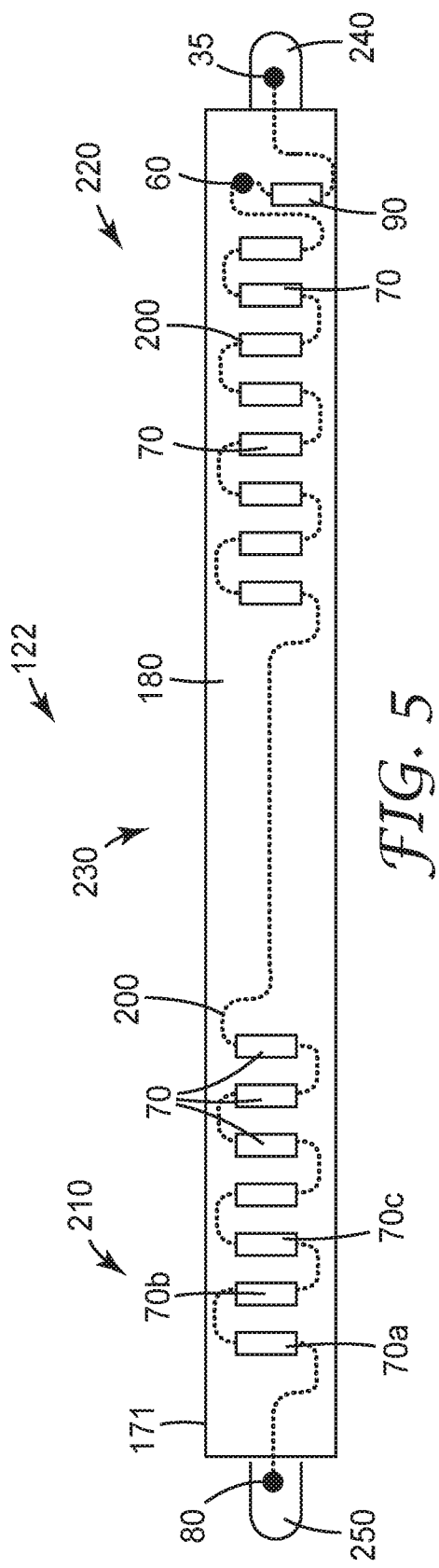
Figure 6:
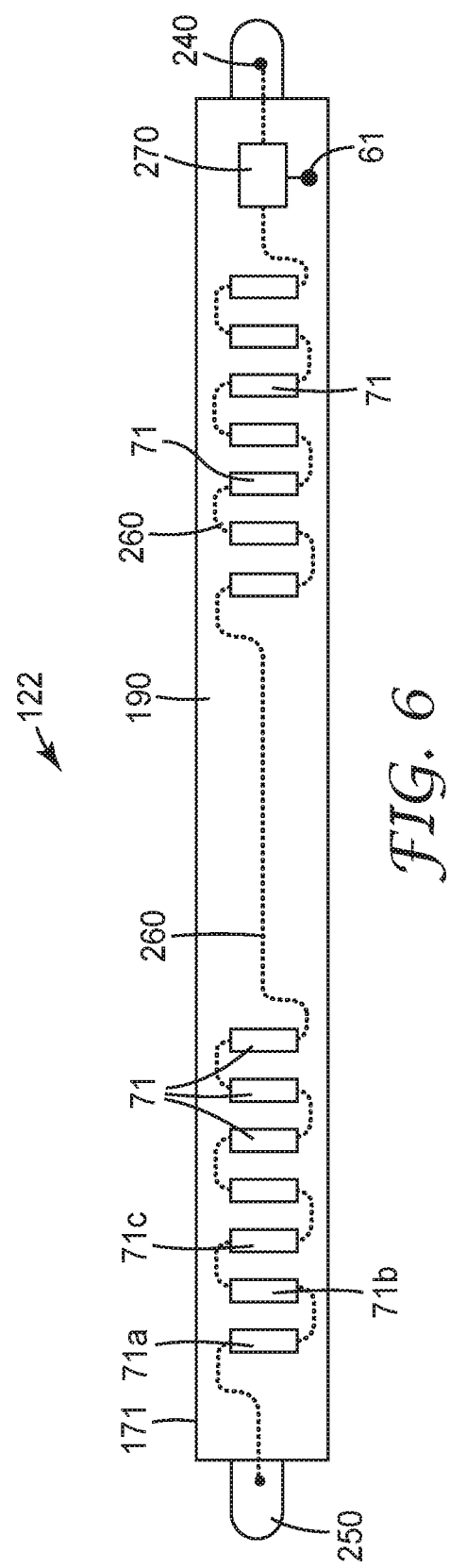
Figure 7:
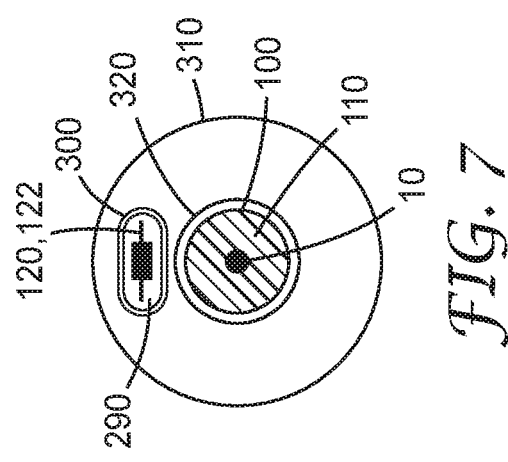
Figure 8:
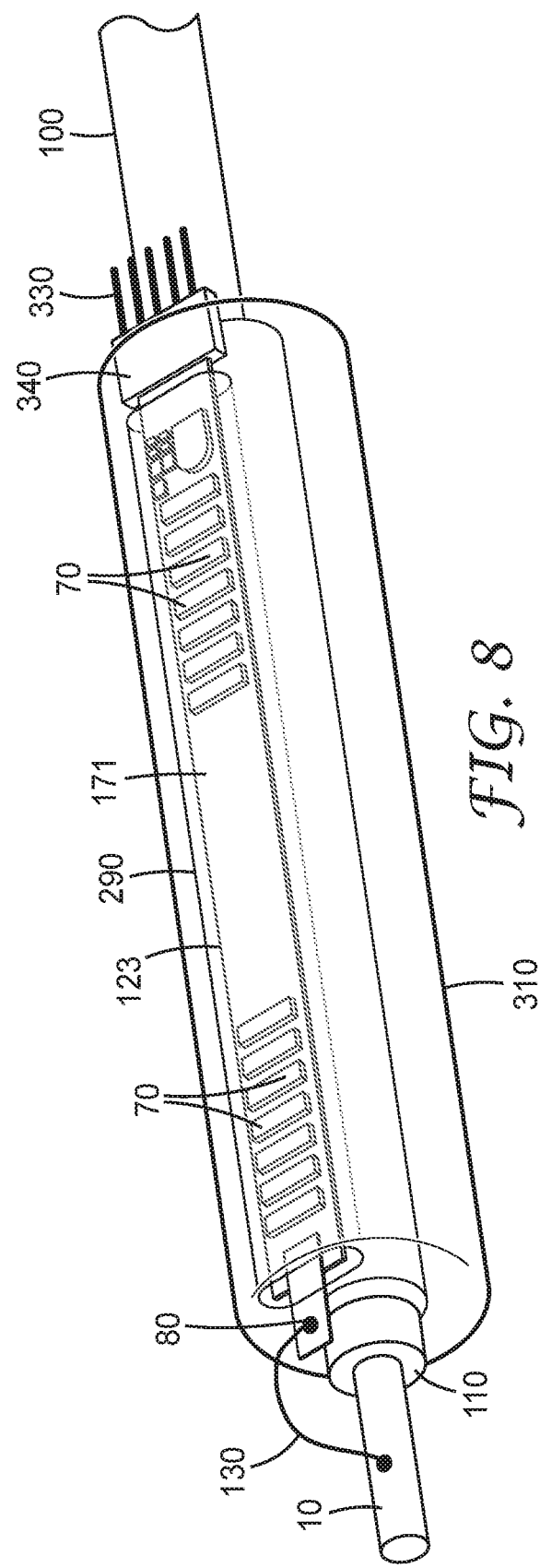
Figure 9:
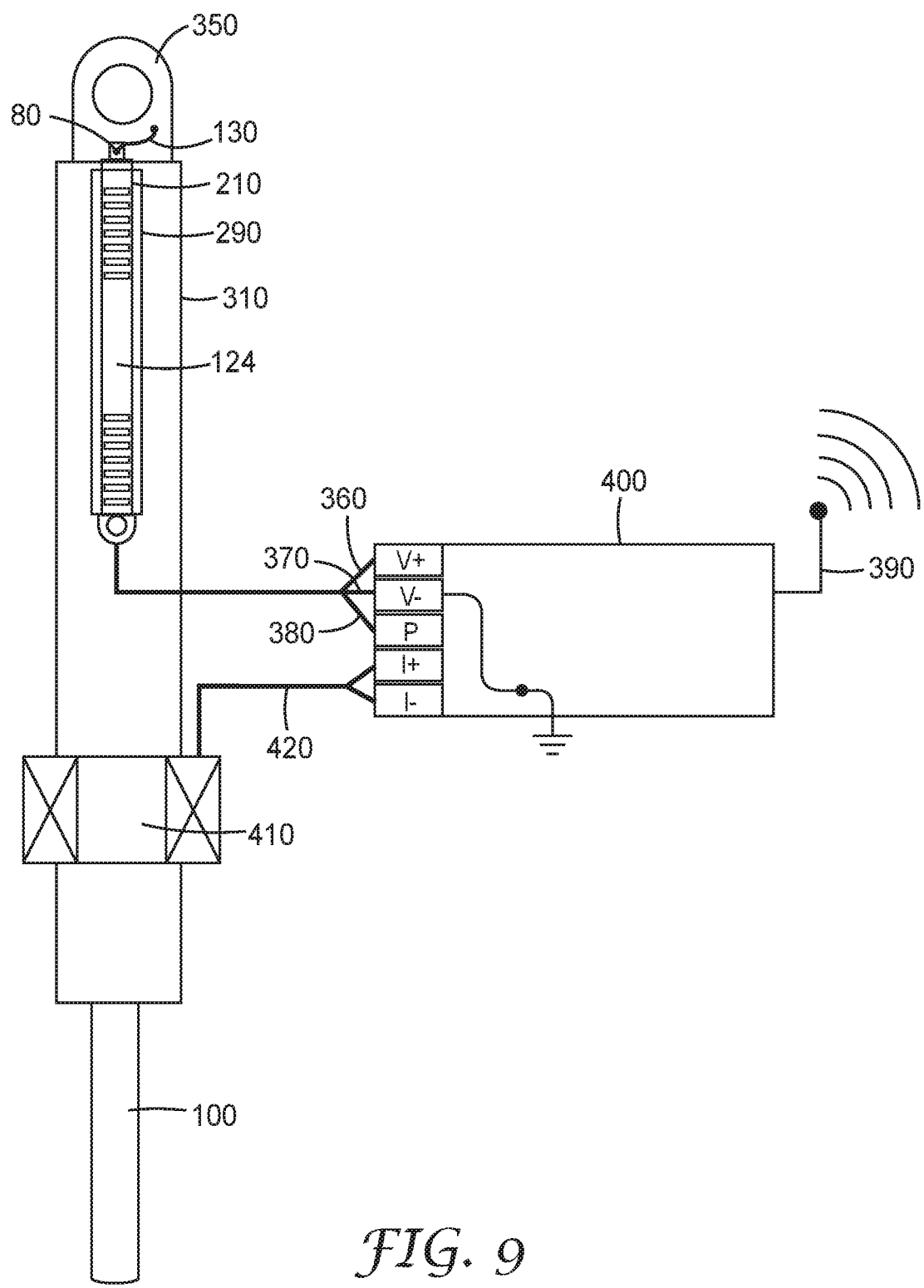
Figure 10:
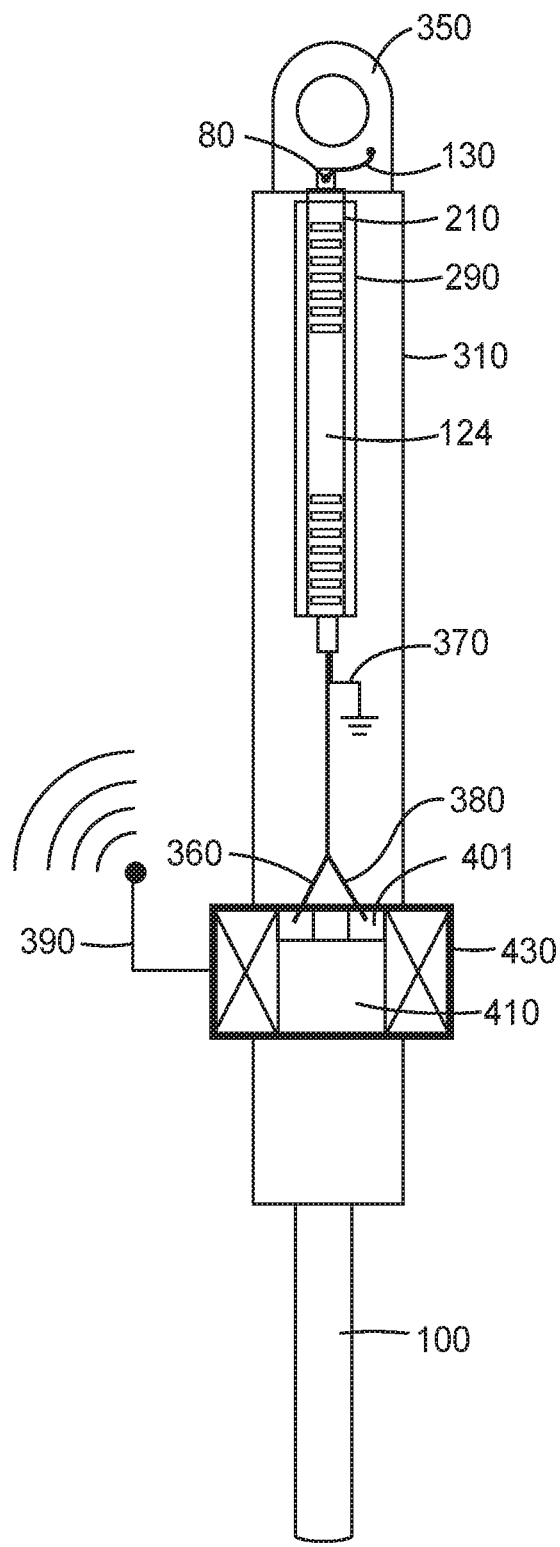
Figure 11:
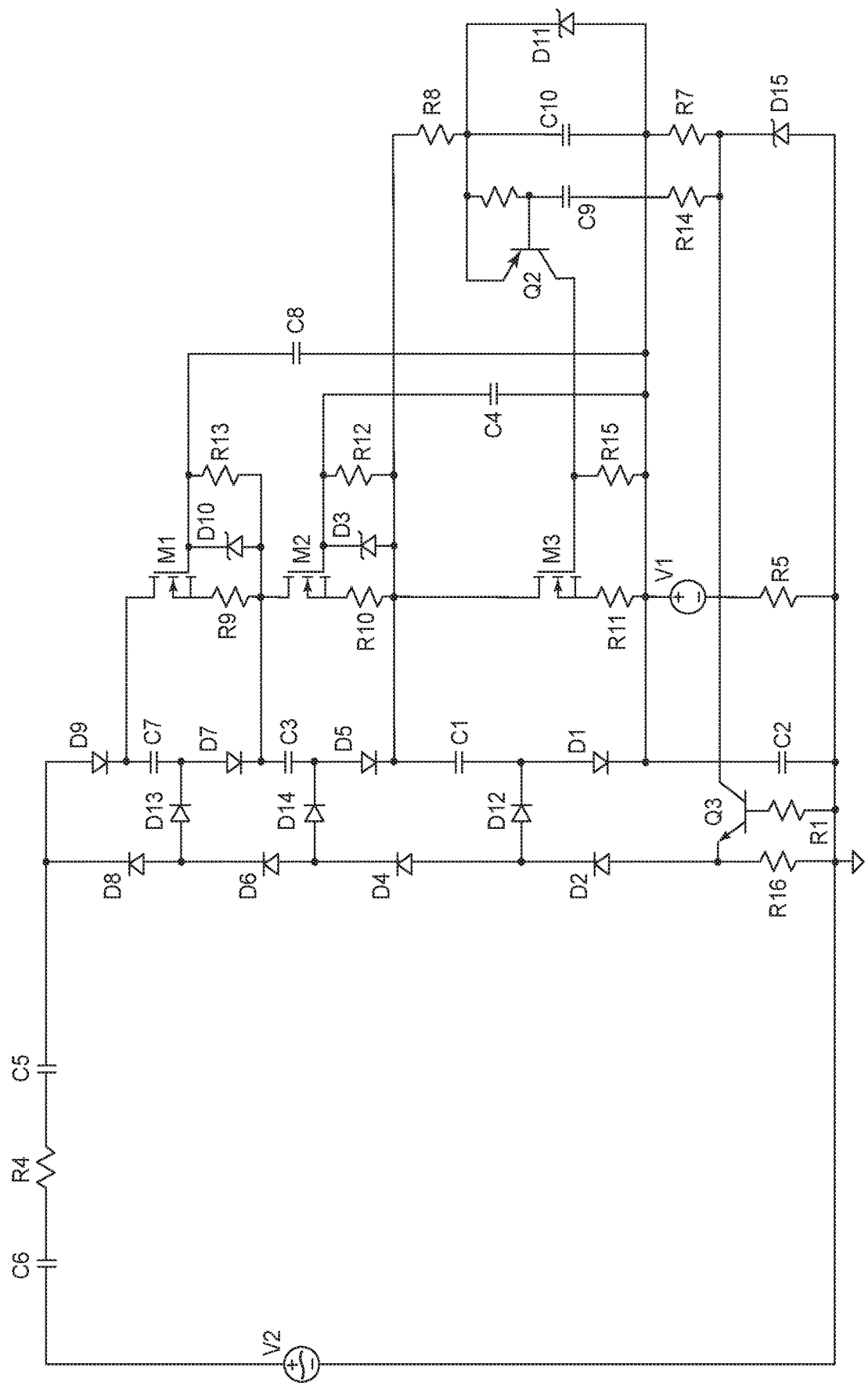

FIG. 1 Circuit diagram showing the principle of a voltage divider;

FIG. 2 Sketch including a circuit diagram of a first impedance assembly according to the present disclosure;

FIG. 3 Sectional view of the first impedance assembly;

FIG. 4 Sectional view of the first impedance assembly, embedded in an encapsulation body;

FIG. 5 Plan view of the upper side of a second impedance assembly according to the present disclosure;

FIG. 6 Plan view of the lower side of the second impedance assembly;

FIG. 7 Sectional view of an impedance assembly according to the present disclosure, encapsulated in a solid encapsulation body, arranged in an elastically expandable cable sleeve;

FIG. 8 Perspective view of the impedance assembly of FIG. 7, encapsulated in a solid encapsulation body, arranged in an elastically expandable cable sleeve;

FIG. 9 System sketch of a fourth impedance assembly, encapsulated in an encapsulation body, arranged in a termination at an end of a power cable, and connected to an external processing unit;

FIG. 10 System sketch of the fourth impedance assembly, encapsulated in an encapsulation body, arranged in a termination at an end of a power cable, and connected to an alternative processing unit;

FIG. 11 Circuit diagram for an inductor-less step-down converter; and

Figure 12:
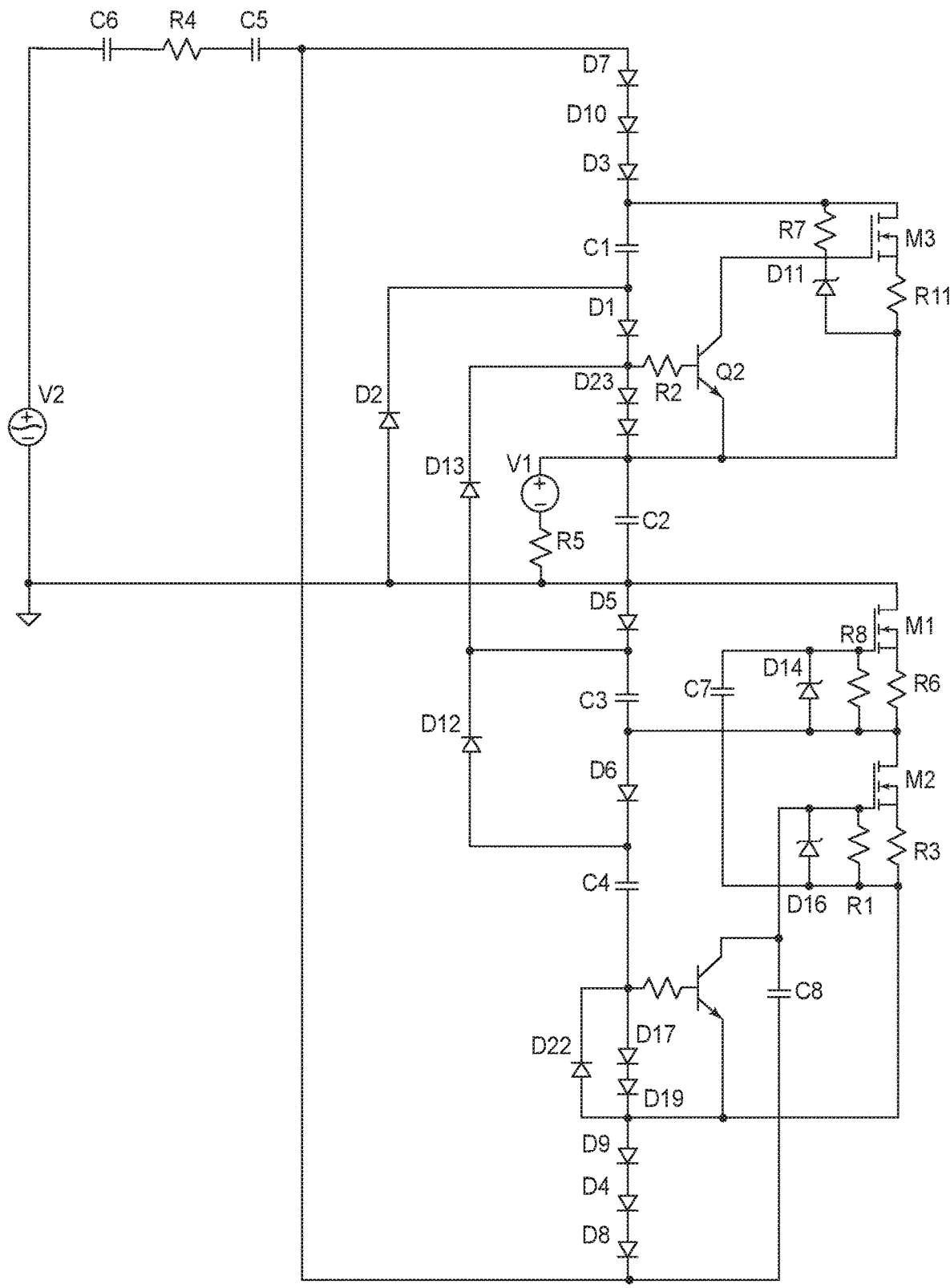

FIG. 12 Circuit diagram for an alternative inductor-less step-down converter.

The circuit diagram of FIG. 1 illustrates the principle of a voltage divider for sensing an AC elevated voltage of a power-carrying conductor 10 in a national grid, such as a bus bar in a MV/HV switchgear or a central conductor of a MV/HV power cable in a national grid. This principle can be used in voltage dividers comprising impedance assemblies according to the present disclosure. When in use, the power-carrying conductor 10 is at a medium or high voltage of between 1 kV and 100 kV with respect to electrical ground, the "network voltage", and conducts alternating currents (AC) of tens of amperes up to hundreds of amperes.

The voltage divider 20 comprises a high-potential portion, namely a high-voltage side 40 or cable side 40, and a low-potential portion, namely a low-voltage side 50 or ground side 50. It further comprises a signal contact 60 and a grounding contact 35 for connection to electrical ground 30. For sensing the voltage of the power-carrying conductor 10, the cable side 40 is conductively connected to the power-carrying conductor 10, and the ground side 50 is connected to electrical ground 30. A divided voltage can be picked up at the signal contact 60 between the cable side 40 and the ground side 50. The divided voltage is proportional to the voltage of the power-carrying conductor 10, with the proportionality factor being the dividing ratio of the voltage divider 20. By measuring the divided voltage, this proportionality is used for sensing the voltage of the power-carrying conductor 10.

The voltage divider 20 shown in FIG. 1 is a capacitive voltage divider 20 for sensing alternating (AC) voltages. Its cable side 40 consists of three dividing impedance elements 70, electrically connected in series between a high-voltage contact 80 and the signal contact 60. The signal contact 60 provides access to the divided voltage. Each of the dividing impedance elements 70 may be a capacitor, a resistor or an inductor.

The ground side 50 of the voltage divider 20 comprises a single impedance element 90, referred to as the low-voltage impedance element 90. It is connected between the signal contact 60 and electrical ground 30. The dividing ratio of the voltage divider 20 is defined as the ratio of the total impedance of the ground side 50 to the total impedance of the cable side 40. If the dividing ratio is, for example, 1:10'000, and the power-carrying conductor 10 is at a voltage 50 kV, the output voltage of the voltage divider 20 at the signal contact 60 is about 5 V. Voltages of that magnitude can be processed by standard electronic circuitry.

The voltage of the power-carrying conductor 10 drops across the three dividing impedance elements 70 from 50 kV to about 5 V on the cable side 40 of the voltage divider 20.

The electrical circuit diagram of FIG. 2 illustrates the elements of a first impedance assembly 120 according to the present disclosure. The power-carrying conductor 10 is the central conductor 10 of a MV power cable 100, which is enveloped by an insulating layer 110. The central conductor 10 is electrically connected to the first impedance assembly 120 via a wire 130.

The impedance assembly 120 comprises elements of two voltage dividers on one PCB 170: Firstly, it comprises a high-voltage side 40 of a first voltage divider 20 (the "sensing voltage divider" 20), which is operable to sense the AC elevated voltage of the central conductor 10 of the power cable 100. Secondly, the impedance assembly 120 comprises a high-voltage side 41 of a second voltage divider 21 (the "harvesting voltage divider" 21), which is operable to harvest electrical energy from the central conductor 10.

Beyond its high-voltage side 40, the sensing voltage divider 20 comprises a low-voltage ground side 50, which—in the embodiment of FIG. 2—is arranged on the same printed circuit board 170 as the high-voltage side 40, but it might alternatively be arranged separate from the impedance assembly 120. The ground side 50 comprises a low-voltage sensing capacitor 150, which is electrically connected to a signal contact 60 of the high-voltage side 40. This low-voltage sensing capacitor 150 corresponds to the low-voltage impedance 90 in FIG. 1. The low-voltage sensing capacitor 150 is connected to electrical ground 30 via a grounding contact 35. A signal voltage can be picked up at the signal contact 60 that varies proportionally with the voltage of the central conductor 10.

The high-voltage side 40 of the sensing voltage divider 20 comprises a first plurality of dividing capacitors 70, namely fourteen dividing capacitors 70, which are electrically connected in series with each other. Each of the capacitors has a capacitance of about 470 pF, so that the total capacitance of the high-voltage side 40 of the sensing voltage divider 20 is about 34 pF.

The dividing capacitors 70 of the high-voltage side 40 of the sensing voltage divider 20 are arranged on the printed circuit board 170. They are arranged linearly to form a straight sensing divider chain.

The harvesting voltage divider 21 has a similar structure as the sensing voltage divider 20: Further to its high-voltage side 41, the harvesting voltage divider 21 comprises a low-voltage ground side 51. The ground side 51 comprises a low-voltage harvesting capacitor 151, connected to electrical ground 30 via the grounding contact 35, and two diodes 160 forming a rectifier. The low-voltage harvesting capacitor 151 is arranged electrically behind one of the diodes 160. The high-voltage side 41 provides a harvesting voltage at a harvesting contact 61, electrically arranged between one of the diodes 160 and the low-voltage harvesting capacitor 151, at the low-voltage end of the harvesting divider chain of impedance elements 71. In the configuration shown in FIG. 2, with the elevated voltage of the power-carrying conductor 10 being 12 kV, and each of the dividing capacitors 71 of the harvesting voltage divider 21 having a capacitance of about 2.2 nF, the harvesting voltage is about 400 Volt, and a current of about 0.3 mA can flow, yielding a harvestable power of about 120 mW.

The high-voltage side 41 of the harvesting voltage divider 21 comprises a first plurality of harvesting dividing capacitors 71, namely fourteen harvesting dividing capacitors 71, which are electrically connected in series with each other. Each of the harvesting dividing capacitors 71 has a capacitance of about 2.2 nF, so that the total capacitance of the high-voltage side 41 of the harvesting voltage divider 21 is about 160 pF.

The dividing capacitors 71 of the high-voltage side 41 of the harvesting voltage divider 21 are arranged on the same printed circuit board 170 and on the same major surface of the PCB 170 as the dividing capacitors 70 of the high-voltage side 40 of the sensing voltage divider 20. Also these dividing capacitors 71 are arranged linearly to form a straight harvesting divider chain.

Both the sensing divider chain and the harvesting divider chain are connected to the high/medium voltage of the central conductor 10 by a wire 130 soldered to a high-voltage contact 80 on the PCB 170 of the impedance assembly 120.

The number of dividing capacitors 70 of the high-voltage side 40 of the sensing capacitor 20 is the same as the number of dividing capacitors 71 of the high-voltage side 41 of the harvesting voltage divider 21. Provided the impedance of the dividing capacitors 71 of the harvesting voltage divider 21 is chosen suitably, and provided that they are arranged suitably relative to the dividing capacitors 70 of the sensing capacitor 20, the dividing capacitors 71 of the harvesting voltage divider 21 can help improve the precision with which the sensing voltage divider 20 senses the voltage of the power-carrying conductor 10. FIG. 3 illustrates, in a longitudinal sectional view, a suitable arrangement of the dividing capacitors 70, 71 arranged on the PCB 170 of the first impedance assembly 120.

The PCB 170 supports, on its upper major surface 180, the impedance elements 70 of the high-voltage side 40 of the sensing voltage divider 20, connected in series between the high-voltage contact 80 and the signal contact 60. The high-voltage contact 80 is arranged on a first end portion 210 of the impedance assembly 120, while the signal contact 60 and the harvesting contact 61 are arranged on the opposite, second end portion 220 of the impedance assembly 120. On its opposed, lower major surface 190, the PCB 170 supports the impedance elements 71 of the high-voltage side 41 of the harvesting voltage divider 21, connected in series between the high-voltage contact 80 and the harvesting contact 61.

Each dividing capacitor 71 of the harvesting voltage divider 21 is arranged directly opposite, i.e. only separated by the thickness of the PCB 170, of a corresponding dividing capacitor 70 of the sensing voltage divider 20. The effect of this arrangement is that the electrical field gradient which each "sensing" dividing capacitor 70, for example the sensing dividing capacitor 70a, "sees" in the direction of the opposed "harvesting" dividing capacitor 71a is much smaller, compared to a scenario where the lower major surface 190 were conductively coated and connected to ground. The "harvesting" dividing capacitor 71a thus provides a form of shielding to the opposite "sensing" dividing capacitor 70a. This smaller potential difference will reduce parasitic currents from this "sensing" dividing capacitor 70a through the PCB 170, which eventually results in a higher measurement accuracy of the sensing voltage divider 40 and a more precise sensing of the voltage of the power-carrying conductor 10.

The same effect shields each of the "sensing" dividing capacitors 70 by a corresponding "harvesting" dividing capacitor 71, which is placed just opposite to the respective "sensing" dividing capacitors 70. As a result, parasitic currents from the high-voltage side 40 of the sensing voltage divider 20 are reduced and the voltage sensing accuracy of the sensing voltage divider 20 is enhanced.

Hypothetically, for optimum shielding, the capacitances of each "sensing" dividing capacitor 70 and of its opposed corresponding "harvesting" dividing capacitor 71 are identical. The sensing voltage divider 20, however, has preferably a high impedance in order to keep its sensing accuracy high. If the harvesting voltage divider 21 were built identically, it would have a high impedance, too. A high impedance of the harvesting voltage divider 21, however, may restrict the current and/or voltage of the harvestable energy too much. In finding an acceptable balance between harvestable power and reduction of parasitic currents, the impedance assembly 120 of FIG. 3 may, for example, have a sensing voltage divider 20 with a high-voltage side 40 having a capacitance of about 34 pF, with each of its sensing dividing capacitors 70 having a capacitance of 470 pF, and a harvesting voltage divider 21 with a high-voltage side 41 having a capacitance of 160 pF, with each of its harvesting dividing capacitors 71 having a capacitance of 2.2 nF. In this example, when the high-voltage contact 80 is connected to a voltage of 12 kV, the voltage at the harvesting contact 61 (the "harvesting voltage") is about 400 Volt DC versus ground 30. This harvesting voltage could be converted into a typical 5V DC supply voltage for electronic circuitry by a standard DC/DC voltage converter connected to the harvesting contact 61.

FIG. 4 is a sectional view of the first impedance assembly 120, shown in FIG. 3, partially encapsulated in a solid encapsulation body 290 which is made of a hardened resin. The PCB 170 with the sensing dividing capacitors 70 and the harvesting dividing capacitors 71 on it is submerged in the resin while the resin is liquid. The resin is then allowed to solidify and harden, so that it forms the solid encapsulation body 290. For clarity, the encapsulation body 290 is shown transparent in FIG. 4, but the encapsulation body 290 may actually be transparent, translucent, or opaque. The resin is a thermosetting material comprising Polyurethane. Alternatively, it is contemplated to use other resins like, for example, epoxy-based thermosetting materials or thermoplastic materials comprising Polyethylene or Polypropylene.

The encapsulation body 290 leaves the portions of the PCB 170 carrying the high-voltage contact 80, the signal contact 60 and the harvesting contact 61 free of resin, so that these contacts remain accessible outside the encapsulation body 290.

Generally, and independent of this specific embodiment, an encapsulation body 290 can provide mechanical stability to impedance assemblies according to the present disclosure, e.g. to the first impedance assembly 120, so that the risk of damage is reduced when pushing such impedance assemblies into a cavity of a termination. Suitably encapsulated impedance assemblies are less likely to break when pushed into a cavity. An encapsulation body 290 can also provide a smooth outer surface around such impedance assemblies, e.g. the impedance assembly 120, so that there are a smaller number of air voids and/or smaller air voids in the cavity of the termination, i.e. in the space between the encapsulation body 290 and the inner wall of such a cavity after insertion of an encapsulated impedance assembly 120 into the cavity. A smooth outer surface around an impedance assembly may generally make insertion of the impedance assembly into a cavity easier.

FIG. 5 illustrates, in a plan view, the upper side of a second impedance assembly 122 according to the present disclosure which carries elements of a sensing voltage divider 20. On the upper major surface 180 of a printed circuit board 171, a first plurality of discrete capacitors 70 is arranged, electrically connected in series with each other by first conductive traces 200. The discrete dividing capacitors 70 are impedance elements. They are electrically connected between a high-voltage contact 80 and a signal contact 60. The dividing capacitors 70 are operable as the high-voltage side 40 of a sensing voltage divider 20 for sensing the AC elevated voltage of a power-carrying conductor 10.

The PCB 171 is a multilayer PCB 171, in which the conductive traces 200 connecting the "sensing" dividing capacitors 70 with each other and with the high-voltage contact 80 and the signal contact 60 are arranged on an internal, i.e. buried, layer of the PCB 171.

The impedance assembly 122 has an elongated shape defining a long extension between a first end portion 210 and an opposed second end portion 220. The sensing dividing capacitors 70 are geometrically arranged in a row which extends parallel to the long extension of the elongated impedance assembly 122.

The sensing dividing capacitors 70 are arranged in two groups, of which one group is on the first end portion 210, and the other group is on the second end portion 220. A middle portion 230 remains free of sensing dividing capacitors 70.

The second impedance assembly 122 further comprises a low voltage sensing capacitor 90, electrically connected between the signal contact 60 and a grounding contact 35. The grounding contact 35, by which the impedance assembly 122 can be connected to electrical ground, is arranged on a conductive grounding tab 240 at the second end portion 220 of the impedance assembly 122, which facilitates connection to other connection elements. Similarly, on the opposed first end portion 210, the high-voltage contact 80 is arranged on a conductive high-voltage tab 250.

FIG. 6 illustrates, in a further plan view, the lower side of the second impedance assembly 122 of FIG. 5. This lower side supports elements of a harvesting voltage divider 21. On the lower major surface 190 of the same printed circuit board 171, a second plurality of discrete capacitors 71 is arranged, electrically connected in series with each other by second conductive traces 260, which are different from the first traces 200 and arranged in a different layer of the multilayer PCB 171. These "harvesting" dividing capacitors 71 are electrically connected between the high-voltage contact 80 and a harvesting contact 61. The harvesting dividing capacitors 71 are operable as the high-voltage side 41 of a harvesting voltage divider 21 for harvesting electrical energy from the power-carrying conductor 10.

The "harvesting" dividing capacitors 71 are positioned such that their arrangement mirrors the arrangement of the "sensing" dividing capacitors 70: Starting from the high-voltage contact 80 and progressing through the respective divider chains, the first harvesting dividing capacitor 71a is positioned directly opposite, on the opposed major surface 190 of the PCB 171, of the corresponding first sensing dividing capacitor 70a, the second harvesting dividing capacitor 71b is positioned directly opposite of the corresponding second sensing dividing capacitor 70b, the third harvesting dividing capacitor 71c is positioned directly opposite of the corresponding third sensing dividing capacitor 70c, and so on. This arrangement provides a certain degree of "shielding", as described above, of the sensing dividing capacitors 70, and a related reduction of parasitic currents, resulting in an increased accuracy of the sensing voltage divider 20, the high-voltage portion 40 of which is formed by the sensing dividing capacitors 70.

Electrically between the chain of harvesting dividing capacitors 71 and the grounding tab 240, a rectifier 270 is arranged. The rectifier 270 is essentially an AC/DC voltage converter which converts the alternating voltage provided by the chain of harvesting dividing capacitors 71 into a rectified (DC) voltage of about 400 V, which is provided to outside of the impedance assembly 122. This harvested voltage can then be transformed to a voltage of 5 V, which can be used to supply off-the shelf electronic circuitry with power. Using alternative devices, the harvested voltage may be transformed, rectified or not, to any other low voltage which is suitable for supplying power to regular electronic circuitry. In the embodiment of FIG. 6, this rectified harvested voltage is made available at the harvesting contact 61 on the lower major surface 190 of the PCB 171.

Where the power-carrying conductor 10 is at a voltage of 12 kV, a chain of fourteen harvesting dividing capacitors 71, each having a capacitance of 2.2 nF, and the rectifier 270 divide the 12 kV down to about 400 V DC at the harvesting contact 61, from which electrical power of more than 100 mW can be harvested.

Referring back to the encapsulation body 290 shown in FIG. 4, it is evident that the second impedance assembly 122 can be encapsulated in a similar encapsulation body 290. An encapsulation body 290 for the second impedance assembly 122 should be shaped suitably to facilitate access to the high-voltage contact 80, to the signal contact 60, to the grounding contact 35 on the grounding tab 240, and to the harvesting contact 61.

FIG. 7 shows, in a sectional view, an impedance assembly 120, 122, as described in the context of FIGS. 2 to 6, encapsulated in a solid encapsulation body 290, arranged in an elongate cavity 300 of an elastically expandable cable sleeve 310. The cable sleeve 310 is made of an elastic insulating rubber material, e.g. like EPDM. It is shown pushed on an end of a partially-stripped power cable 100, in which an insulating layer 110 envelopes the power-carrying central conductor 10. The power cable 100 is arranged in a straight tubular receiving space 320 of the sleeve 310. This receiving space 310 and the cavity 300 extend parallel to each other in the length direction of the cable 100. The sleeve 310 insulates the cable 100 and accommodates the impedance assembly 120, 122.

Instead of having a signal contact 60, a separate grounding contact 35 on a grounding tab 240, and a separate harvesting contact 61 on the PCB 170, 171 at the second end portion 220 of the first impedance assembly 120 or the second impedance assembly 122, an impedance assembly according to the present disclosure may have one, two, three or all of these contacts arranged in an interface connector, preferably arranged at the second end portion 220 and connected to the PCB 170, 171. A third impedance assembly 123 according to the present disclosure, comprising such an interface connector 340 is illustrated in FIG. 8, in a perspective view and described below. Such an interface connector may be, for example, a commercially available ruggedized board-to-board connector or a ruggedized connector for mating with a matching plug at an end of a wire. One of its connector contacts ("pins") is electrically connected to the signal contact 60, another pin is electrically connected to the harvesting contact 61, and a further pin is electrically connected to the grounding contact 35. The interface connector may thus transmit harvested energy to an external processing unit in order to supply this unit with power.

Where the signal voltage of the sensing voltage divider 20 is processed and digitized on the impedance assembly 120, 122 itself, the interface connector may comprise a pin for transmitting a digital signal from the impedance assembly 120, 122 to an external processing unit, for example an RTU box. Certain interface connectors may transmit signals also optically. Certain of those interface connectors may comprise a light source for transmitting a digital signal or an analogue signal from the impedance assembly 120, 122 to an external processing unit, for example an RTU box.

It is contemplated to provide an impedance assembly 120, 122 according to the present disclosure with an EEPROM which may contain information about the actual impedance assembly 120, 122, such as, for example, information indicating a type of the impedance assembly 120, 122, identification information of the impedance assembly 120, 122, its electrical configuration, or calibration data of the impedance assembly 120, 122. The interface connector may be designed to carry a digital bi-directional signal, so that data from the EEPROM can be read out.

Now, FIG. 8 illustrates the third impedance assembly 123, encapsulated in an encapsulation body 290 and arranged in a cavity of an elastic expandable sleeve 310, which in turn is arranged around a partially stripped power cable 100 having an insulation layer 110 enveloping a central power-carrying conductor 10. The third impedance assembly 123 is identical to the second impedance assembly 122, except that it has no grounding tab 240, and that the grounding contact 35, the signal contact 60 and the harvesting contact 61 are formed as respective pins 330 arranged in an interface connector 340. The pins 330 stick out of the encapsulation body 290 and out of the sleeve 310, so that a mating plug can be connected to them. The interface connector 340 is mechanically firmly connected to the substrate of the PCB 171.

For greater clarity, the encapsulation body 290 and the elastic sleeve 310 have been drawn in FIG. 8 as if they were transparent, whereas in reality they may each be transparent, translucent or opaque, respectively.

In certain embodiments, the electrical power harvested from the harvesting voltage divider 21 is used to supply a separate processing unit with power. This is illustrated, in a system sketch, in FIG. 9.

In FIG. 9, a fourth impedance assembly 124, similar to the first impedance assembly 120, encapsulated in an encapsulation body 290, is arranged in an elastic sleeve 310, which forms a termination at an end of a power cable 100. Its high-voltage end portion 210 is electrically connected to a conductive lug 350 by a wire 130. The lug 350, in turn, is connected to the central power-carrying conductor 10 of the cable 100 inside the sleeve 310.

A first wire 360 transmits the signal voltage from the signal contact 60 of the fourth impedance assembly 124 to a remote processing unit 400, a second wire 370 connects the grounding contact 35 to electrical ground in the processing unit 400, and a third wire 380 transmits harvested power from the harvesting contact 61 to the processing unit 400 to provide it with electrical power.

The processing unit 400 comprises electronic circuitry (not shown) to sense signal voltage, which is representative of the AC elevated voltage of the power-carrying conductor 10 of the cable 100, using the high-voltage portion 40 of the sensing voltage divider 20. The processing unit 400 transmits data containing a value of this sensed voltage to the network operator in a wireless manner via an antenna 390. For that purpose, the processing unit 400 comprises a wireless Bluetooth interface which transmits according to the IEC 60870-5-103 protocol, facilitating a direct data connection of the impedance assembly 124 to a device, e.g. a so-called RTU ("Remote Terminal Unit") of a network operator. Obviously, alternative other wireless transmission interfaces and/or other transmission protocols may be used.

The processing unit 400 also receives, via wires 420, electrical signals from a Rogowski-type current sensor 410, which is arranged in the termination 310 close to the impedance assembly 124, but separate from it. The processing unit 400 can thus also determine the current flowing through the power-carrying conductor 10 of the cable 100, process these signals using the power harvested by the impedance assembly 124, and transmit data containing the sensed current in the same wireless manner.

In alternative embodiments to the one shown in FIG. 9, the remote processing unit is not accommodated in a separate housing, but in the housing of the current sensor 410.

FIG. 10, a system sketch, illustrates one such alternative embodiment. The fourth impedance assembly 124, encapsulated in an encapsulation body 290, is again arranged in an elastic sleeve 310, which forms a termination at an end of a power cable 100. Its high-voltage end portion 210 is electrically connected by a wire 130 to a conductive lug 350, which in turn is connected inside the sleeve 310 to the central power-carrying conductor 10 of the cable 100.

The processing unit 401 comprises electronic circuitry (not shown) to sense the AC elevated voltage of the power-carrying conductor 10 of the cable 100, using the high-voltage portion 40 (formed by the sensing dividing capacitors 70 of the impedance assembly 124) of the sensing voltage divider 20. Similar to the embodiment shown in FIG. 9, a first wire 360 transmits the signal voltage from the signal contact 60 of the impedance assembly 124 to the processing unit 401. The processing unit 401 is accommodated in a housing 430 which also houses the current sensor 410.

A second wire 370 connects the grounding contact 35 to a grounded shielding braid (not shown) of the cable 100 at a location inside the sleeve 310.

A third wire 380 transmits harvested power from the harvesting contact 61 of the impedance assembly 124 to the processing unit 401 to provide it with electrical power. The processing unit 401 transmits data containing a value of the sensed AC elevated voltage of the power-carrying conductor 10 to the network operator in a wireless manner via an antenna 390. The antenna 390 is shown arranged outside the housing 430. However, it is contemplated that it may also be arranged inside the housing 430. For wireless transmission, the processing unit 401 comprises a wireless Bluetooth interface which transmits according to the IEC 60870-5-103 protocol, facilitating a direct data connection of the impedance assembly 124 to a Remote Terminal Unit of a network operator.

Where the current sensor 410 has the toroidal shape of a Rogowski coil around the cable 100, electronic circuitry of the processing unit 401 can be arranged on an annular flat printed circuit board (not shown), which in turn is accommodated in the housing 430 of the Rogowski coil. The annular PCB may have a central aperture through which the central power-carrying conductor 10 of the cable 100 can be routed.

FIG. 11 is a circuit diagram of an inductor less step-down converter to convert elevated voltages in the range of kilovolts down to about 400V, which can be handled by regular, commercially available step-down converters to provide output voltages of 5V DC to power electronic circuitry. This step-down converter may be arranged on the PCB 170 as shown for the harvesting voltage divider 21 in FIGS. 2 and 3, and can be used for energy harvesting instead of the harvesting voltage divider 21 described in the context of FIG. 2. The step-down converter is realized by charging stages of serially connected capacitors over a high impedance from the elevated voltage of the power-carrying conductor 10. After a charging cycle (50/60 Hz) each capacitor stage will be discharged to an output capacitor which is connected to ground. This way an input to output ratio of 1:(number of stages) can be provided.

In the step-down converter of FIG. 11, V2 is the elevated voltage of the power-carrying conductor 10, which is connected by C6, C5 and a high-impedance resistor R4 to the input of the converter. C6 and C5 are each a placeholder for thirteen capacitors of 4.7 nF each, electrically connected in series. These two times thirteen capacitors form a plurality of impedance elements. The positive half wave of the elevated voltage charges capacitors C7, C3, C1 and C2 via diodes D9, D7, D5 and D1. The current of the negative half wave of the elevated voltage flows over diodes D8, D6, D4, D2 and resistor R16. As soon as the voltage drop on resistor R16 reaches the threshold voltage Vbe of transistor Q3, the collector of transistor Q3 generates a negative slope, which triggers the base of transistor Q2 for a short time. For this short time Q2 triggers the gate of the Mos-Fet M3, which connects the upper side of C1 (800V) to output capacitor C2. C1 discharges its charge over diodes D12, D2 and resistor R16 into C2. At the same time the source of Mos-Fet M2 is moving from 800V to 400V, which triggers the gate of M2. This is because the gate of M2 is coupled via C4 to a fixed voltage. This way the upper side of C3 (on 1200V) will also be connected via M2 and M3 to the output capacitor C2 and discharges its charge over D14, D4, D2 and R16 into the output capacitor C2. The next stage using C7 and M1 is working the same way. After a few milliseconds all transistors switch off and the next positive half wave can be received to charge the serially connected capacitors C7, C3, C1, and C2.

The number of stages of this converter can be varied depending on the output power required. The step-down converter shown in FIG. 11 uses only two time phases for each converting cycle and four capacitors to divide the elevated voltage by four.

FIG. 12 is a circuit diagram of an alternative inductor less step-down converter, similar to the step-down converter of FIG. 11. The converter of FIG. 11 provides a one-way rectification of the AC elevated voltage. This will lead to a DC load on the capacitors 71 of the capacitive harvesting voltage divider 21. The DC resistance of capacitors is in the range of tera ohms with a large variability. The dividing ratio of the harvesting voltage divider is therefore not precisely known. The circuit shown in FIG. 12 provides a two-way rectification, thus helping to avoid a DC load on the capacitors 71 of the harvesting voltage divider 21. Again, the step-down converter of FIG. 12 may be arranged on the PCB 170 as shown for the harvesting voltage divider 21 in FIGS. 2 and 3, and can be used for energy harvesting instead of the harvesting voltage divider 21 described in the context of FIG. 2.

In FIG. 12, V2 is the elevated AC voltage of the power-carrying conductor 10, which is connected via capacitors C6, C5 and a high impedance resistor R4 to the input of the step-down converter. C6 and C5 are each a placeholder for thirteen capacitors of 4.7 nF each, electrically connected in series.

The positive wave of the elevated voltage charges capacitors C1 and C2 via diodes D7, D10, D3, D1, D23 and D24 in series. During this time transistor Q2 is switched on and pulls the gate of Mos-fet M3 down. M3 is switched off. As soon as the positive charging current goes down to zero, Q2 switches off and the gate of M3 is released to be charged over resistor R7. M3 switches on and discharges C1 via diode D2 to the output capacitor C2. The current of the negative half wave flows over diodes D8, D4, D9, D19, D17, D6, D5 and charges capacitors C4 and C3 in series. At this time transistor Q1 is switched on and pulls down the gate of Mos-fet M2. M2 is switched off. Mos-Fet M1 is switched off also. As soon as the negative charging current goes down to zero, Q1 switches off and the gate of M2 is released to be charged over capacitor C8. M2 switches on and discharges C4 over diodes D22 and D12 to C3. The drain/source voltage of M2 drops down, which results in charging the gate of M1 over capacitor C7. M1 is turning on and discharges C3 via diodes D13, D23 and D24 to the output capacitor C2. At this time the currents of both half waves multiplied by two are stored in the output capacitor C2. The voltage at the input of the rectifier swings between +800V and −800V, which leads to DC-less operation of the harvesting voltage divider C5 and C6.

What is claimed is:

1. Impedance assembly for use in a voltage divider for sensing an AC elevated voltage of at least 1 kV versus ground of a power-carrying conductor distributing electrical energy in a national grid, wherein the impedance assembly comprises
   a) a printed circuit board;
   b) an externally accessible high-voltage contact for connection to the power-carrying conductor;
   c) a first plurality of impedance elements comprising a capacitive voltage divider, arranged on the printed circuit board and electrically connected to the high-voltage contact and in series with each other such as to be operable in a first voltage divider for sensing the elevated voltage of the power-carrying conductor;
wherein the impedance assembly further comprises
   d) a second plurality of impedance elements, arranged on the printed circuit board and electrically connected to the high-voltage contact and in series with each other such as to be operable in a second voltage divider for harvesting electrical energy from the power-carrying conductor.

2. Impedance assembly according to claim 1, wherein the printed circuit board has a first major outer surface and an opposed second major outer surface, and wherein the first plurality of impedance elements is arranged on the first major outer surface, and the second plurality of impedance elements is arranged on the second major outer surface.

3. Impedance assembly according to claim 2,
   wherein a first impedance element of the first plurality of impedance elements is arranged at a first position on the first major outer surface, and a first impedance element of the second plurality of impedance elements is arranged at the same first position on the second major outer surface; and
   wherein a second impedance element of the first plurality of impedance elements is arranged at a second position on the first major outer surface, and a second impedance element of the second plurality of impedance elements is arranged at the same second position on the second major outer surface.

4. Impedance assembly according to claim 1, wherein the first plurality of impedance elements is arranged to form a straight row of impedance elements or two straight rows of impedance elements.

5. Impedance assembly according claim 1, wherein
   each impedance element of the first plurality of impedance elements has a same first nominal impedance, and/or
   each impedance element of the second plurality of impedance elements has a same second nominal impedance.

6. Impedance assembly according to claim 1, wherein each impedance element of the first plurality of impedance elements is a discrete, surface-mounted capacitor, and/or each impedance element of the second plurality of impedance elements is a discrete, surface-mounted capacitor.

7. Impedance assembly according to claim 1, wherein the first plurality of impedance elements comprises more than twenty impedance elements, and/or wherein the second plurality of impedance elements comprises more than twenty impedance elements.

8. Impedance assembly according to claim 1, further comprising a signal contact, connected to the first plurality of impedance elements such as to provide a signal voltage that varies proportionally with the elevated voltage of the power-carrying conductor.

9. Impedance assembly according to claim 8, further comprising an interface connector for mechanical and electrical mating with a corresponding plug, wherein the interface connector comprises a plurality of connector contacts for transmitting electrical signals into the plug, and wherein one of the connector contacts is electrically connected to the signal contact.

10. Sensing assembly comprising:
    a) an impedance assembly according to claim 8, and
    b) a processing unit, electrically connected to the signal contact and powered by electrical energy harvested by the second voltage divider, for processing the signal voltage and sensing the AC elevated voltage versus ground of the power-carrying conductor.

11. Sensing assembly according to claim 10, wherein the processing unit comprises an antenna for wirelessly transmitting a signal indicative of the AC elevated voltage versus ground of the power-carrying conductor.

12. Sensing assembly according to claim 11, wherein the processing unit comprises a Bluetooth interface for wirelessly transmitting the signal according to a protocol described in part 5 of standard 60870 of the International Electrotechnical Commission IEC, as in force on 26 Apr. 2019.

13. Sensing assembly according to claim 10, further comprising
    c) a current sensor, connected to the processing unit, for sensing a current through the power-carrying conductor, and
    d) a housing containing a component of the current sensor, wherein the processing unit is arranged in the housing.

14. Power network for distributing electrical energy in a national grid, comprising a sensing assembly according to claim 10.

15. Impedance assembly according to claim 1, at least a portion of which is encapsulated in a solid, electrically insulating encapsulation body.

16. Impedance assembly according to claim 1, wherein the respective impedances of the second plurality of impedance elements are chosen such that the second voltage divider can harvest electrical energy of at least 50 milliwatt from the power-carrying conductor.

17. Impedance assembly according to claim 1, wherein the second plurality of impedance elements is comprised in an inductor-less step-down converter to convert the elevated voltage of the power-carrying conductor to a voltage of 400 Volt or less.

18. Impedance assembly according to claim 17, wherein the inductor-less step-down converter converts the positive and the negative half-wave of the elevated AC voltage of the power-carrying conductor to a voltage of 400 Volt or less.

19. Power network for distributing electrical energy in a national grid, comprising an impedance assembly according to claim 1.

20. Impedance assembly according to claim 1, wherein the second plurality of impedance elements comprises a capacitive harvesting voltage divider.

* * * * *